(12) United States Patent
Blair et al.

(10) Patent No.: US 6,404,022 B1
(45) Date of Patent: Jun. 11, 2002

(54) AM/PM NON-LINEARITIES IN FETS

(75) Inventors: Cynthia Blair, Morgan Hill; Jan K. Johansson, Upplands Vasby; Geoffrey Olson, San Jose, all of CA (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/794,461

(22) Filed: Feb. 26, 2001

(51) Int. Cl.$^7$ ................................................ H01L 29/72
(52) U.S. Cl. ...................... 257/391; 257/343; 257/345; 257/337; 257/339; 257/392; 257/401
(58) Field of Search .................. 257/345, 343, 257/337, 339, 391, 392, 401

(56) References Cited

U.S. PATENT DOCUMENTS 5,317,180 A * 5/1994 Hutter et al. ............... 257/343

* cited by examiner

Primary Examiner—Edward Wojciechowicz
(74) Attorney, Agent, or Firm—Lyon & Lyon LLP

(57) ABSTRACT

When a field effect transistor (e.g., an LDMOSFET) saturates, the electrons traveling through the device slow down. This causes a phase shift with respect to electrons that travel through the device when the device is not saturated. By providing a shorter signal path for the electrons during saturation, it is possible to compensate for the slower speed of the electrons so that the electrons will take the same amount of time to travel through the device regardless of whether the device is saturated or not.

22 Claims, 3 Drawing Sheets

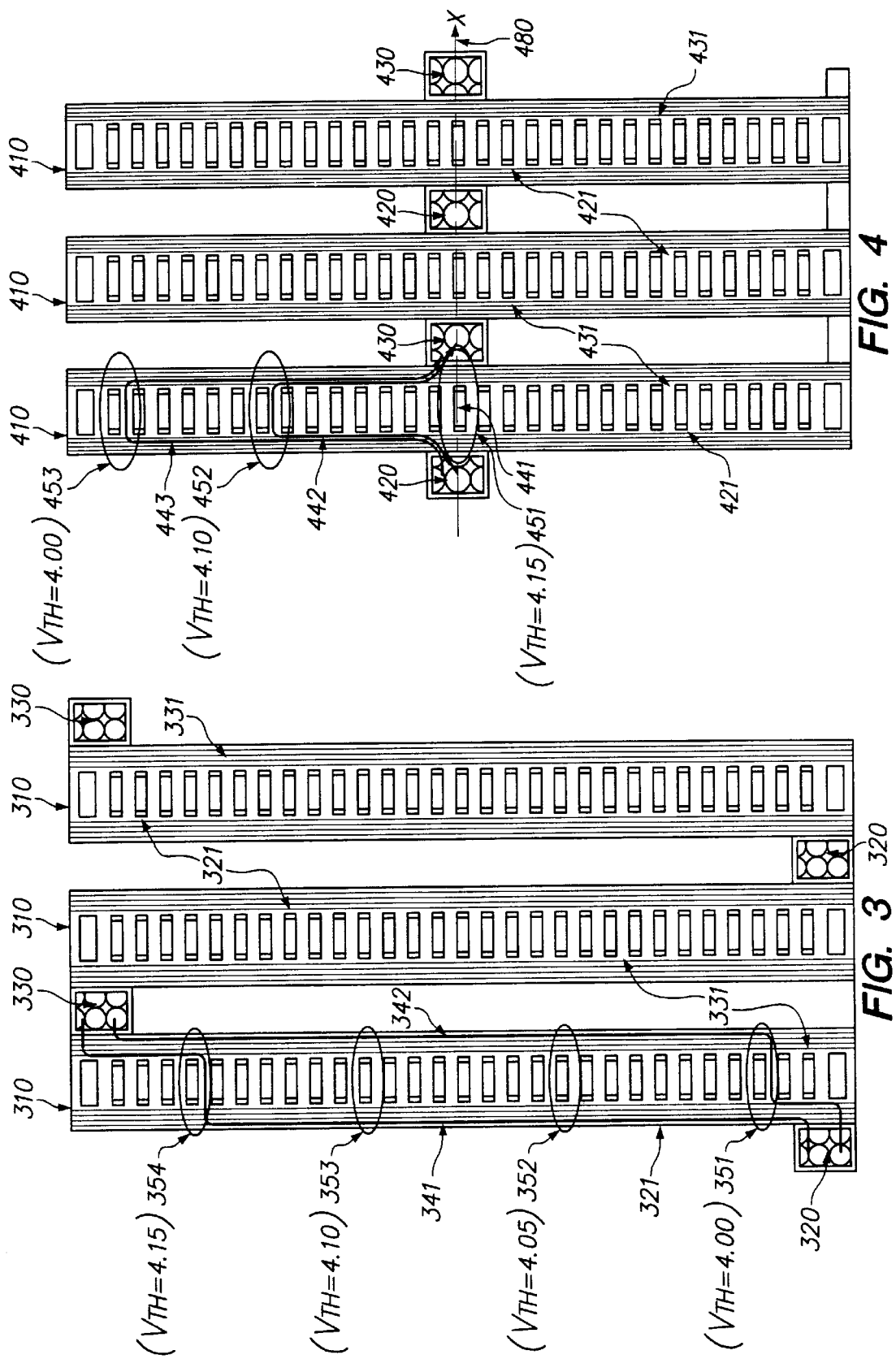

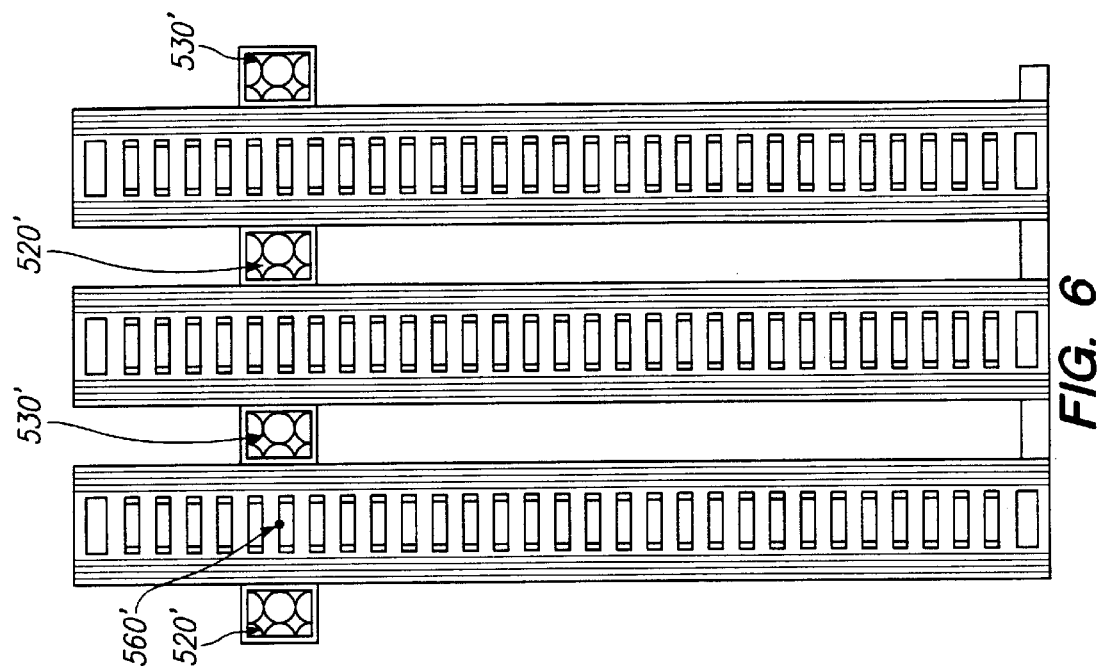
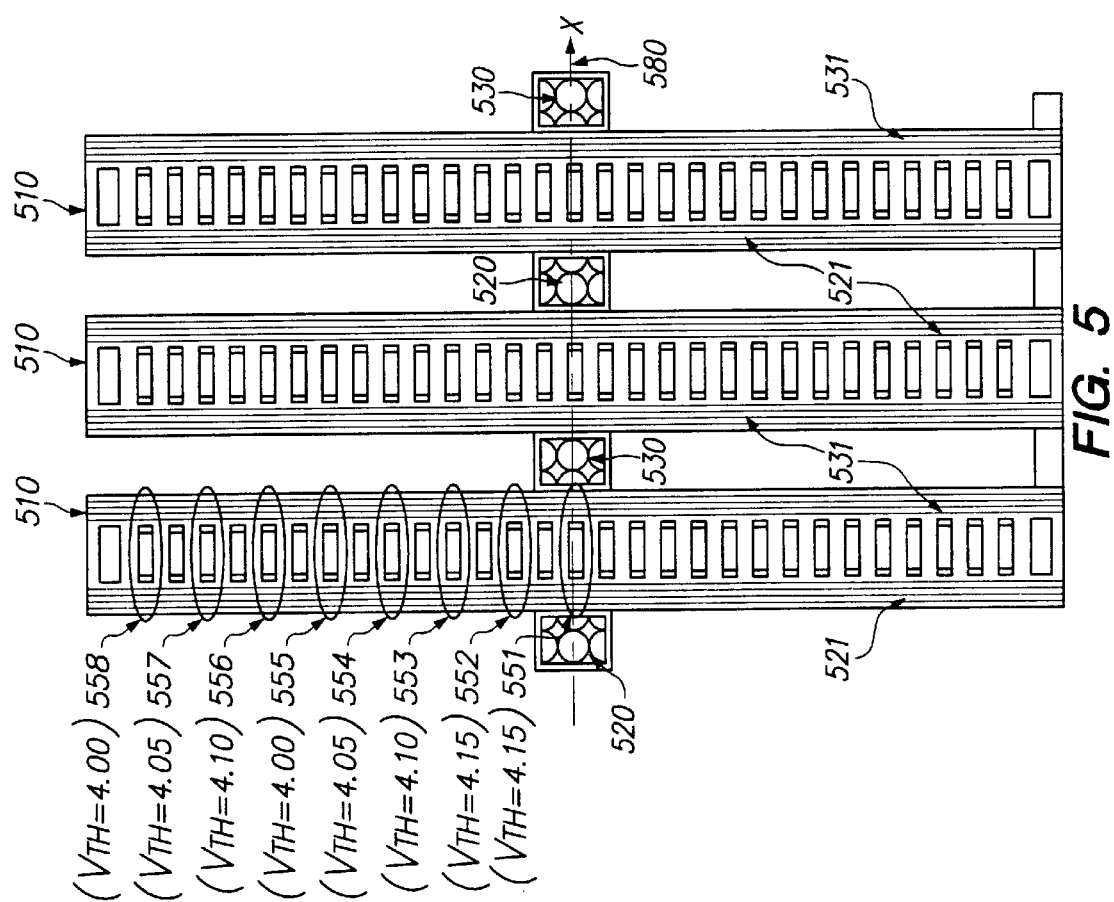

AM/PM NON-LINEARITIES IN FETS

BACKGROUND OF THE INVENTION

1. Field of the Invention

The present invention relates to power FET devices including LDMOS FET devices. More specifically, the present invention relates to compensating for AM/PM non-linearities in such devices.

2. Background

FIG. 1A is an overall plan view of an exemplary geometry for a conventional high power laterally diffused metal oxide semiconductor (LDMOS) field effect transistor (FET) device. The illustrated device includes three active chips 110. Each active chip 110 contains a plurality of gate-drain pairs including gate-drain pairs 151, 152, 153. Reference numbers for the remaining GDPs in the active chips 110 have been omitted for clarity. FIG. 1B is a magnified cross section of an LDMOS FET. Each of the gate-drain pairs (GDPs) includes a gate 195 (indicated by a suffix G in FIG. 1A) and a drain 196 (indicated by a suffix D in FIG. 1A). The gate and drain regions are indicated by the suffixes "G" and "D" in FIG. 1A.

LDMOS devices incorporate a deep $p^+$ region 190 or "$p^+$ sinker" that connects through to a bulk $p^+$ region 191 on the bottom of the die. The source terminal (not shown) is electrically connected to this bulk $p^+$ region 191 of the active chip 110. Returning now to FIG. 1A, the gate terminal (not shown) of the device is connected to a gate bond pad 120 in any conventional manner (using, e.g., a gold wire). A conductor 121 provides an electrically conductive path between the gate bond pad 120 and each of the gate regions 151G, 152G, 153G in the GDPs 151, 152, 153. Similarly, the drain terminal (not shown) of the device is connected to a drain bond pad 130 in any conventional manner, and a conductor 131 provides an electrically conductive path between the drain bond pad 130 and each of the drain regions 151D, 152D, 153D in the GDPs 151, 152, 153.

The GDPs are arranged in a linear array, and resemble a stack of fingers. Because the gate bond pad 120 is connected to the gate portion of each GDP 151–153, and the drain bond pad 130 is connected to the drain portion of each GDP, the GDPs (taken together with the source) act like a plurality of transistors connected in parallel. In conventional LDMOS devices, the doping levels are uniform for all of the fingers, and the contribution from each of these parallel-connected transistors to the output signal is substantially the same.

FIG. 2 shows how the output power varies with respect to the input power in an example of an LDMOS device. Initially, in region 201, the relationship between the input power and the output power is highly linear. But as the power increases, two compression effects occur. First, an amplitude compression effect occurs because at some point the FET will leave the linear region 201 and enter the saturation region 202, where the increase in output power does not keep up with increases in input power. It should be appreciated that the reference to "saturation" is with respect to "saturation" of the RF signal, and is not referring to the saturation region of the transistor where the current becomes constant (independent of drain voltage) for a certain gate voltage.

Second, in the saturation region 202, the electrons traveling through the device tend to slow down. As a result, it takes longer for a large amplitude input signal to propagate through the device and arrive at the output than it does for small and medium amplitude input signals. This increase in travel time appears as a phase shift at the output. This effect is known as AM/PM distortion (amplitude modulation to phase modulation distortion) because large amplitude signals are distorted by a phase shift that is not experienced by small and medium amplitude signals.

Operating LDMOS devices in class AB mode provides high linearity and high efficiency. In general, decreasing the output power in a class AB circuit results in improved linearity.

Thus, there is a need for reducing or eliminating the phase shift experienced by large amplitude input signals during saturation.

SUMMARY OF THE INVENTION

The present invention relates to compensating for phase shifts caused by speed variations between different signals that travel through a semiconductor device.

One aspect of the present invention relates to a field effect transistor that includes a plurality of gate regions and a corresponding plurality of drain regions configured to form a plurality of gate-drain pairs. This plurality of gate-drain pairs includes (a) a first set of gate-drain pairs with relatively high threshold turn-on voltages, and (b) a second set of gate-drain pairs with threshold turn-on voltages that are lower than the threshold turn-on voltages of the first set. The field effect transistor also includes a gate bond pad and an electrical connection between the gate bond pad and the plurality of gate regions. This electrical connection is configured so that a path length between the gate bond pad and gate regions in the first set is shorter than a path length between the gate bond pad and gate regions in the second set. The field effect transistor also includes a drain bond pad and an electrical connection between the drain bond pad and the plurality of drain regions. This electrical connection is configured so that a path length between the drain bond pad and drain regions in the first set is shorter than a path length between the drain bond pad and drain regions in the second set. The field effect transistor also includes a source operatively associated with the plurality of gate-drain pairs.

Another aspect of the present invention relates to a field effect transistor that includes a plurality of gate regions and a corresponding plurality of drain regions configured to form a plurality of gate-drain pairs. These gate-drain pairs are arranged in a linear array. The plurality of gate-drain pairs includes (a) a first set of gate-drain pairs with relatively high threshold turn-on voltages located near a reference point on the linear array, and (b) a second set of gate-drain pairs with threshold turn-on voltages that are lower than the threshold turn-on voltages of the first set located away from the reference point. The field effect transistor also includes a gate bond pad located near the reference point, and an electrical connection between the gate bond pad and the plurality of gate regions that is configured so that a path length between the gate bond pad and gate regions in the first set is shorter than a path length between the gate bond pad and gate regions in the second set. The field effect transistor also includes a drain bond pad located near the reference point, and an electrical connection between the drain bond pad and the plurality of drain regions that is configured so that a path length between the drain bond pad and drain regions in the first set is shorter than a path length between the drain bond pad and drain regions in the second set. The field effect transistor also includes a source operatively associated with the plurality of gate-drain pairs.

Another aspect of the present invention relates to a semiconductor device that includes a first terminal and a second terminal, and first and second signal paths between the first terminal and the second terminal. The first signal path has a first length, and the second signal path has a second length that is longer than the first length. Doping variations between the first signal path and the second signal path cause slower-moving carriers to travel through the first path and faster-moving carriers to travel through the second path.

BRIEF DESCRIPTION OF THE DRAWINGS

FIG. 3 is a schematic illustration of a geometry of an improved LDMOS FET device.

FIG. 4 is a schematic illustration of a geometry of a further-improved LDMOS FET device.

FIG. 5 is a schematic illustration of a geometry of the further-improved LDMOS FET device, with a preferred distribution of threshold voltages.

FIG. 6 is a schematic illustration of a geometry of a another improved LDMOS FET device, with the bond pads in a different location.

DETAILED DESCRIPTION OF THE PREFERRED EMBODIMENTS

Figure 1B:
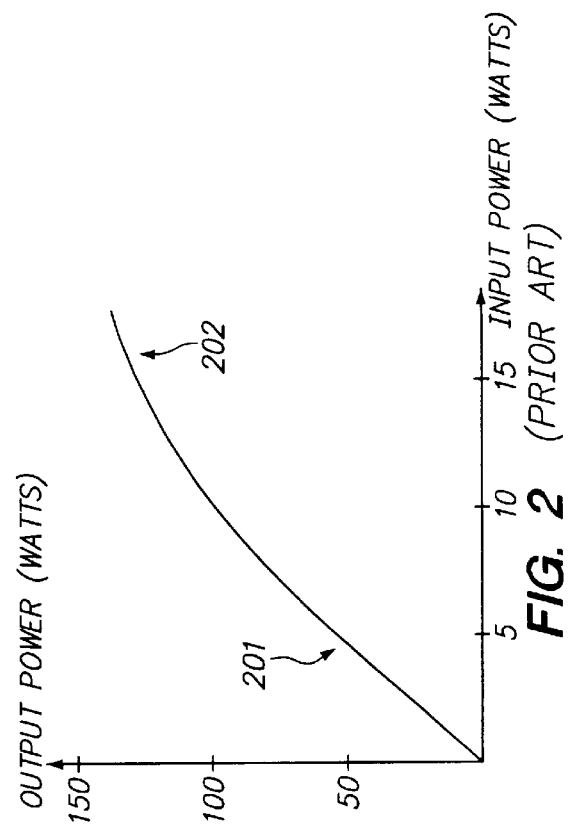
FIG. 1B is a magnified cross section view of the LDMOS FET device of FIG. 1A.
Figure 2:
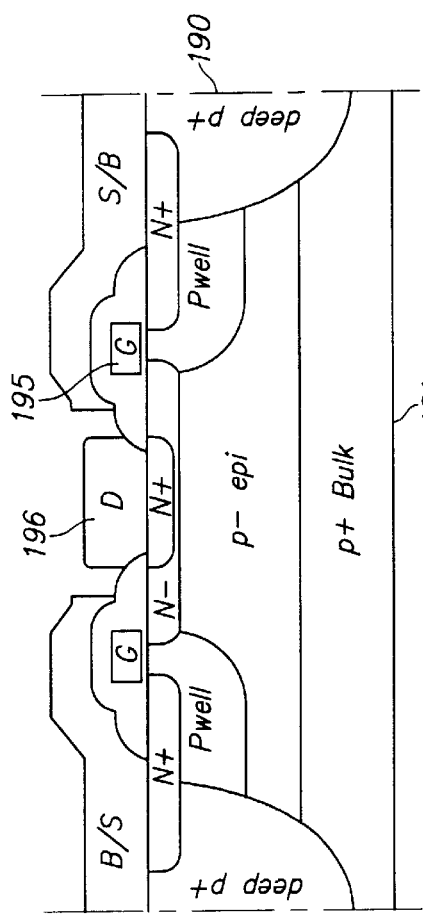
FIG. 2 is a graph of the power transfer function of the LDMOS FET of FIG. 1.

When the doping levels are uniform for all of the fingers, as described above, the contribution from each finger to the output is substantially the same. In addition, when the doping levels are uniform, the threshold turn-on voltage is substantially the same for each finger.

The present invention recognizes that overall linearity of a power LDMOS device can be improved by designing different threshold voltages into different fingers of the device, particularly in the class AB operating mode. Differences in the threshold voltages may be produced by varying the doping levels in the channel region of the device. One effective way to adjust the doping levels is ion implantation. Of course, a variety of other semiconductor fabrication techniques may be substituted for ion implantation, as will be appreciated by persons skilled in the art.

When a range of different threshold voltages are implemented, input signals with smaller amplitudes will activate the fingers with lower threshold voltages, but will not activate the fingers with higher threshold voltages. In this case, only the fingers with lower threshold voltages will contribute to the output. As the amplitude of the input signal rises to the point where the threshold voltage for additional fingers is reached, those additional fingers will begin to contribute to the output. This continues until, for a large enough input signal, all of the fingers contribute to the output. A device implemented with multiple thresholds in this manner can be thought of as a plurality of individual transistors connected in parallel, where each the individual transistors have different characteristics so the they only contribute to the output when they are needed.

FIG. 3 is an example of such a device. The FIG. 3 embodiment includes three active chips 310. The geometry of the gate regions, the drain regions, and the source of these active chips 310 is similar to the geometry of the active chips 110 described above in connection with FIG. 1. Each active chip 310 includes a plurality of GDPs including GDPs 351, 352, 353, 354. Reference numbers for the remaining GDPs in the active chips 310 have been omitted for clarity. Conductors 321 provide an electrically conductive path between a gate bond pad 320 and each of the gate regions in the GDPs 351–354. Similarly, conductors 331 provide an electrically conductive path between a drain bond pad 330 and each of the drain regions in the GDPs 351–354.

Figure 1A:
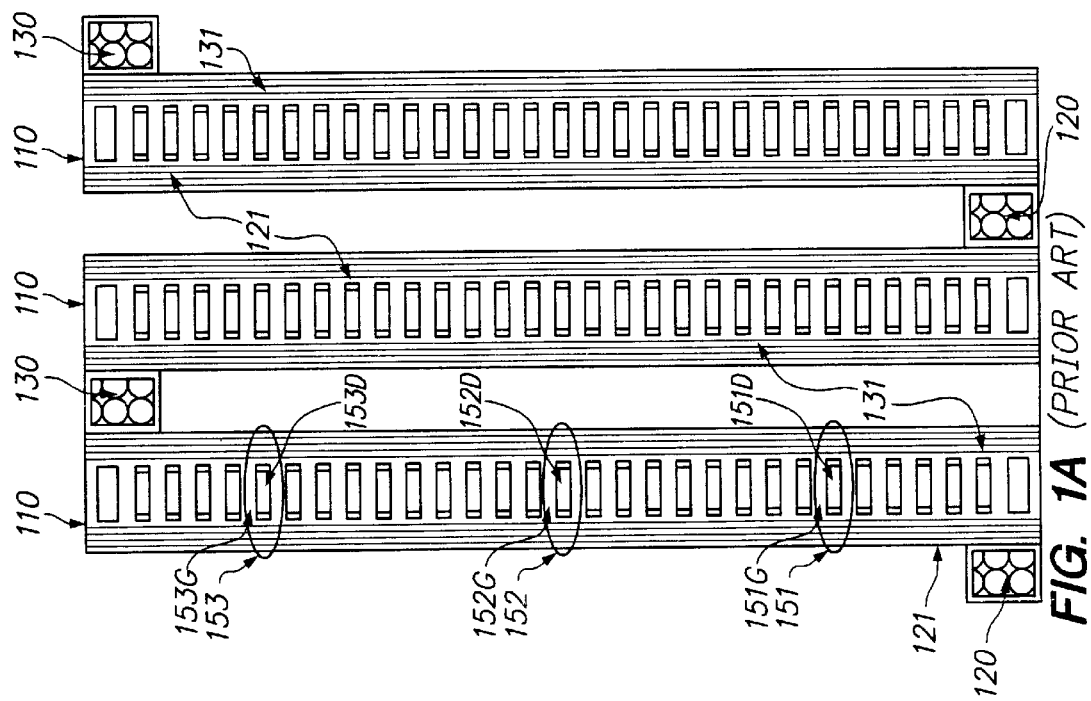
FIG. 1A is a schematic overall plan view of an exemplary geometry of a conventional LDMOS FET device.

As in the FIG. 1 embodiment, the GDPs (taken together with the source) act like a plurality of transistors connected in parallel. However, unlike the FIG. 1 embodiment, the doping in the various GDPs is adjusted (e.g., by changing the ion implantation) so that the threshold voltages for each GDP is not the same. In the illustrated configuration, the threshold voltages for the GDPs 351, 352, 353, and 354 are 4.00, 4.05, 4.10, and 4.15 Volts respectively. Because the GDP 351 has the lowest illustrated threshold voltage, it will be activated by a relatively small input signal. Thus, when a small input signal is applied to the gate bond pad 320, it will travel through the conductor 321, through the activated GDP 351, and up through the conductor 331 to the drain bond pad 330. This path is labeled with reference number 342.

As the input signal amplitude increases, GDPs with increasingly higher threshold voltages become activated (in addition to the GDPs with lower threshold voltages, which remain activated). Eventually, when the signal amplitude becomes sufficiently large, the GDP 354 with the highest threshold voltage will become activated. The portion of the signal that travels through the GDP 354 travels from the gate bond pad 320, through the conductor 341 to the GDP 354, and continues through the conductor 331 to the drain bond pad 330. The path followed by this portion of the signal is illustrated by reference number 341. Because signals with different amplitudes are amplified by different GDPs, the characteristics of those GDPs can be optimized so that the signal stays in the sweet spot, thereby improving linearity.

Although the FIG. 3 embodiment has better linearity than the FIG. 1 embodiment, once the input signal has increased to the point where the last GDP has been activated, further increases in output current will cause the device to enter the saturation region. But because the total length of the path 342 followed by smaller amplitude signals is about the same as the total length of the path 341 followed by larger amplitude signals, and because electrons travel slower during saturation, the larger amplitude signals will take longer to arrive at the output. This results in the same phase-shift effect (and the same AM/PM distortion) as the FIG. 1 embodiment.

FIG. 4 depicts an embodiment that corrects the AM/PM distortion associated with the above-described embodiments. The FIG. 4 embodiment includes three active chips 410, and the geometry of the gate regions, the drain regions, and the source of these active chips 410 is similar to the geometry of the above-described embodiments. Each active chip 410 includes a plurality of GDPs (including GDPs 451–453) arranged in a linear array. Reference numbers for the remaining GDPs in the active chips 410 have been omitted for clarity. Conductors 421 provide an electrically conductive path between a gate bond pad 420 and each of the gate regions in the GDPs 451–453. Similarly, conductors 431 provide an electrically conductive path between a drain bond pad 430 and each of the drain regions in the GDPs 451–453.

As in the FIG. 3 embodiment, the GDPs (taken together with the source) act like a plurality of transistors connected in parallel, with their doping adjusted so that they have different threshold voltages. In the illustrated configuration, the threshold voltages for the GDPs 451, 452, and 453 are 4.15, 4.10, and 4.00 Volts respectively. However, unlike the FIG. 3 embodiment, the signal path lengths in the FIG. 4 embodiment are not all the same.

In the FIG. 4 embodiment, the gate bond pads 420 and the drain bond pads 430 are located near the middle of the active chips 410 instead of at their ends. In addition, the doping of the GDPs is configured so that the GDPs with the highest threshold voltage (e.g. GDP 451) are located near the middle of the active chip 410 and the remaining GDPs with lower threshold voltages (e.g. GDPs 452, 453) are distributed throughout the remainder of the active chip 410. These remaining GDPs may all share the same threshold voltage as one another, or may be arranged in a plurality of batches where the GDPs in each batch all share the same threshold voltage. Preferably, the threshold voltages below the X-axis 480 are distributed in a manner similar to the distribution of threshold voltages above the X-axis. The distribution of threshold voltages below the X-axis 480 is not shown to simplify the figure.

With this arrangement, small and medium amplitude input signals will activate the GDPs 452, 453 with lower threshold voltages, and the signals will travel through the longer paths 442, 443 on the way between the gate bond pad 420 and the drain bond pad 430. At these lower signal amplitudes, the GDPs 451 near the middle of the active chip 410 are not activated. When an input signal is sufficiently large, the GDPs 451 near the middle of the active chip 410 will be activated, and the signal will travel from the gate bond pad 420 to the drain bond pad 430 through a relatively short path 441.

As discussed above, when the device operates in the saturation region, electrons travel through the device more slowly. But because travel time equals distance divided by speed, the shorter distance of the signal path 441 through the middle GDP 451 (with respect to the remaining signal paths 442, 443) can compensate for the slower electron speed so that the time remains constant. As a result, the phase shift that would otherwise occur in the saturation region can be reduced or eliminated.

If the threshold voltages for the GDPs are selected so that the GDPs with the highest threshold voltages are located in the middle of the active chip 410, and the threshold voltages gradually decrease towards the ends of the active chips, then: (1) all of the GDPs that handle the smallest amplitude signals will be located far away from the bond pads 420, 430; (2) all the GDPs that handle the medium amplitude signals will be located a medium distance away from the bond pads 420, 430; and (3) all the GDPs that handle the largest amplitude signals will be located very close to the bond pads 420, 430. While this arrangement would compensate for the slow electron speed associated with the largest amplitude signals (by providing a short path between the bond pads 420, 430), the resulting path length 453 for the smallest amplitude signals is longer than the path length 452 for the medium amplitude signals. But, because the small and medium amplitude signals travel at about the same speed, this increased path length causes an undesirable phase shift for the smallest amplitude signals with respect to the medium amplitude signals.

To avoid this undesirable result, is best not to gradually reduce the threshold voltages as distance from the middle increases for the various GDPs. Instead, a more uniform distribution of threshold voltages is preferred.

FIG. 5 is similar to FIG. 4, except that the threshold voltages are more evenly distributed throughout the active chip so that small and medium signals encounter the same delays traveling through the device. The FIG. 5 embodiment includes three active chips 510, and the geometry of the gate regions, the drain regions, and the source of these active chips 510 is similar to the geometry of the above-described embodiments. Each active chip 510 includes a plurality of GDPs (including GDPs 551–558) arranged in a linear array. Reference numbers for the remaining GDPs in the active chip 510 and the GDPs located below the X-axis 580 have been omitted for clarity. Conductors 521 provide an electrically conductive path between a gate bond pad 520 and each of the gate regions in the GDPs 551–558. Similarly, conductors 531 provide an electrically conductive path between a drain bond pad 530 and each of the drain regions in the GDPs 551–558. The bond pads 520, 530 are located near the middle of the active chips 510.

In the FIG. 5 embodiment, The doping of the GDPs is configured so that the GDPs with the highest threshold voltage (e.g. GDP 551, 552) are located near the middle of the active chip 510. The threshold voltages of the remaining GDPs (e.g. GDPs 553–558) are distributed in a uniform manner throughout the remainder of the active chip 510. These remaining GDPs may all share the same threshold voltage as one another, or may be arranged in a plurality of batches where the GDPs in each batch all share the same threshold voltage. In the illustrated configuration, the threshold voltages are arranged in batches as follows: 4.10 Volts for the GDPs 553, 556; 4.05 Volts for the GDPs 554, 557; and 4.00 Volts for the GDPs 555, 558. Preferably, the threshold voltages below the X-axis 580 are distributed in a manner similar to the distribution of threshold voltages above the X-axis The relatively uniform distribution of GDPs with any given threshold voltage throughout the active chip 510 insures that the path lengths through the active chips 510 for all non-saturating signals will be more or less the same. Thus, a small amplitude signal be handled by those GDPs 555, 558 with the lowest threshold voltage of 4.00 Volts, some of which are relatively close to the middle of the active chip 510 and some of which are farther away. Similarly, medium amplitude signals will travel through some shorter paths and some longer paths. Only the largest amplitude signals (which are the only signals that can cause saturation) receive a path that is shorter than all other paths (i.e., the path between the bond pads 520, 530 through the GDPs 551, 552). As a result, phase compensation is only provided for the signals with the largest amplitude, but not for any other signals.

In alternative embodiments, the bond pads may be moved away from the middle to a different reference point. In FIG. 6, for example, a reference point 560' is located one-fifth of the way down the linear arrays 510' and the gate bond pads 520' and drain bond pads 530' are both located near the reference point 560'. In these alternative embodiments, the GDPs with the highest threshold voltages should be positioned near the reference point 560' to obtain the speed-up provided by the shorter paths.

By providing a shorter signal path when the FET device operates in the saturation region, the above-described embodiments advantageously compensate for undesirable phase shifts that were heretofore associated with slower-traveling signals during saturation.

While the present invention has been explained in the context of an LDMOS FET with threshold voltages in the vicinity of 4 Volts, it may also be used at other threshold voltage levels (e.g., 8 or 12 Volts). The present invention may also be used in FET devices other than LDMOS FETS, or in other semiconductor devices including minority carrier devices and majority carrier devices, as will be apparent to persons skilled in the relevant art. Moreover, while the present invention has been explained in the context of the preferred embodiments described above, various changes may be made to those embodiments and various equivalents may be substituted without departing from the scope of the invention, as will be apparent to persons skilled in the relevant art.

We claim:

1. A field effect transistor device, comprising:
    a plurality of gate regions and a corresponding plurality of drain regions configured to form a plurality of gate-drain pairs including a first set of gate-drain pairs having relatively high threshold turn-on voltages and a second set of gate-drain pairs having threshold turn-on voltages lower than the threshold turn-on voltages of the first set;
    a gate bond pad;
    an electrical connection between the gate bond pad and each of the plurality of gate regions, the electrical connection configured such that a current path between the gate bond pad and gate regions in the first set is shorter than a current path between the gate bond pad and gate regions in the second set;

a drain bond pad;

an electrical connection between the drain bond pad and the plurality of drain regions, the electrical connection configured such that a current path between the drain bond pad and drain regions in the first set is shorter than a current path between the drain bond pad and drain regions in the second set; and a source operatively associated with the plurality of gate-drain pairs.

2. The field effect transistor device of claim 1, wherein the threshold turn-on voltages of the first set of gate-drain pairs are substantially the same.

3. The field effect transistor device of claim 1, wherein the threshold turn-on voltages of the first set of gate-drain pairs are substantially the same, and wherein the threshold turn-on voltages of the second set of gate-drain pairs are substantially the same.

4. The field effect transistor device of claim 1, wherein the threshold turn-on voltages of the first set of gate-drain pairs are substantially the same, and the wherein second set of gate-drain pairs include at least two different threshold turn-on voltages.

5. The field effect transistor device of claim 4, wherein the path lengths between the respective bond pads and the gate and drain regions of the second set of gate-drain pairs are distributed in a relatively uniform manner for each of the different threshold turn-on voltages.

6. The field effect transistor device of claim 1, wherein the field effect transistor device is a LDMOS device.

7. The field effect transistor device of claim 1, wherein the field effect transistor device is operated in a class AB mode.

8. A field effect transistor device, comprising:

a plurality of gate regions and a corresponding plurality of drain regions configured to form a plurality of gate-drain pairs arranged in a linear array, the linear array of gate-drain pairs including a first set of gate-drain pairs having relatively high threshold turn-on voltages located near a reference point on the linear array, and (b) a second set of gate-drain pairs having threshold turn-on voltages lower than the threshold turn-on voltages of the first set and located away from the reference point;

a gate bond pad located near the reference point;

an electrical connection between the gate bond pad and each of the plurality of gate regions, the electrical connection configured such that a current path between the gate bond pad and gate regions in the first set of gate-drain pairs shorter than a current path between the gate bond pad and gate regions in the second set of gate-drain pairs;

a drain bond pad located near the reference point;

an electrical connection between the drain bond pad and the plurality of drain regions, the electrical connection configured such that a current path between the drain bond pad and drain regions in the first set of gate-drain pairs shorter than a current path between the drain bond pad and drain regions in the second set of gate-drain pairs; and a source operatively associated with the plurality of gate-drain pairs.

9. The field effect transistor device of claim 8, wherein the reference point is located at a middle point of the linear array.

10. The field effect transistor device of claim 8, wherein the reference point is located near a middle point of the linear array.

11. The field effect transistor device of claim 8, wherein the reference point is located away from a middle point of the linear array.

12. The field effect transistor device of claim 8, wherein the threshold turn-on voltages of the first set of gate-drain pairs are substantially the same.

13. The field effect transistor device of claim 8, wherein the threshold turn-on voltages of the first set of gate-drain pairs are substantially the same, and wherein the threshold turn-on voltages of the second set of gate-drain pairs are substantially the same.

14. The field effect transistor device of claim 8, wherein the threshold turn-on voltages of the first set of gate-drain pairs are substantially the same, and wherein the second set of gate-drain pairs includes at least two different threshold turn-on voltages.

15. The field effect transistor device of claim 8, wherein the current paths between the respective bond pads and the gate and drain regions in the second set are distributed in a relatively uniform manner for each of the different threshold turn-on voltages.

16. The field effect transistor device of claim 8, wherein the field effect transistor is an LDMOS device.

17. The field effect transistor device of claim 8, wherein the field effect transistor is operated in a class AB mode.

18. A semiconductor device comprising:

a first terminal;

a second terminal;

a first signal path between the first terminal and the second terminal, the first signal path having a first length; and a second signal path between the first terminal and the second terminal, the second signal path having a second length that is longer than the first length, wherein the second signal path is physically separated from the first signal path by at least one intervening structure, and wherein doping variations between the first signal path and the second signal path cause slower-moving carriers to travel through the first path and faster-moving carriers to travel through the second path.

19. The semiconductor device of claim 18, wherein both the slower-moving carriers and the faster-moving carriers are electrons.

20. The semiconductor device of claim 18, wherein both the slower-moving carriers and the faster-moving carriers are holes.

21. The semiconductor device of claim 18, wherein the second length is at least twice as long as the first length.

22. The semiconductor device of claim 18, wherein the semiconductor device is an LDMOS field effect transistor.

* * * * *